United States Patent

Ohata et al.

[11] Patent Number: 5,493,148
[45] Date of Patent: Feb. 20, 1996

[54] SEMICONDUCTOR DEVICE WHOSE OUTPUT CHARACTERISTIC CAN BE ADJUSTED BY FUNCTIONAL TRIMMING

[75] Inventors: Yu Ohata, Tokyo; Koichi Kitahara; Yosuke Takagi, both of Yokohama, all of Japan

[73] Assignee: Kabushiki Kaisha Toshiba, Kawasaki, Japan

[21] Appl. No.: 956,466

[22] Filed: Oct. 2, 1992

Related U.S. Application Data

[63] Continuation of Ser. No. 680,257, Apr. 4, 1991, abandoned.

[30] Foreign Application Priority Data

Apr. 6, 1990 [JP] Japan .................................. 2-91396

[51] Int. Cl.$^6$ .................................................. H01L 29/00
[52] U.S. Cl. .......................... 257/538; 257/529; 338/195; 338/197; 338/203
[58] Field of Search .............................. 357/51; 338/184, 338/185, 197, 199, 203; 257/536, 537, 538, 529

[56] References Cited

U.S. PATENT DOCUMENTS

| | | | |
|---|---|---|---|
| 3,812,478 | 5/1974 | Tomisawa et al. | 357/51 |
| 4,016,483 | 4/1977 | Rudin | 323/74 |
| 4,150,366 | 4/1979 | Price | 338/195 |
| 4,201,970 | 5/1980 | Onyshkevych | 338/195 |
| 4,549,131 | 10/1985 | Kusazaki | 357/51 |
| 4,710,791 | 12/1987 | Shirato et al. | 357/51 |
| 4,775,884 | 1/1988 | Erdi | 357/51 |
| 4,792,779 | 12/1988 | Pond et al. | 338/195 |
| 4,870,472 | 9/1987 | Vyne | 357/51 |
| 4,906,966 | 3/1990 | Imamura et al. | 338/195 |
| 4,984,054 | 1/1991 | Yamada et al. | 257/529 |

Primary Examiner—Ngân V. Ngô
Attorney, Agent, or Firm—Finnegan, Henderson, Farabow, Garrett & Dunner

[57] ABSTRACT

A semiconductor device includes a resistor network having a plurality of trimming polysilicon resistors. The polysilicon resistors have the same width and different lengths and can be selectively fused according to the value of current which is caused to flow therein. The resultant resistance of the resistor network is changed by selectively fusing the polysilicon resistors. The output characteristic of the semiconductor device can be adjusted by changing the resultant resistance.

10 Claims, 4 Drawing Sheets

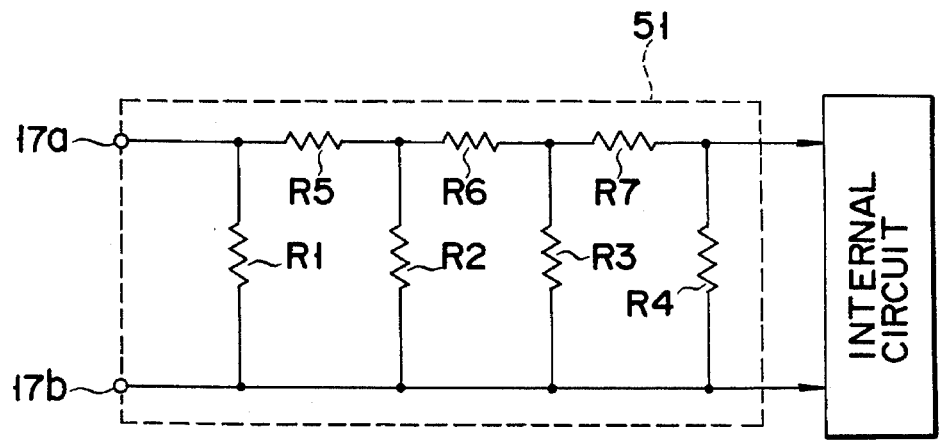
F I G. 3
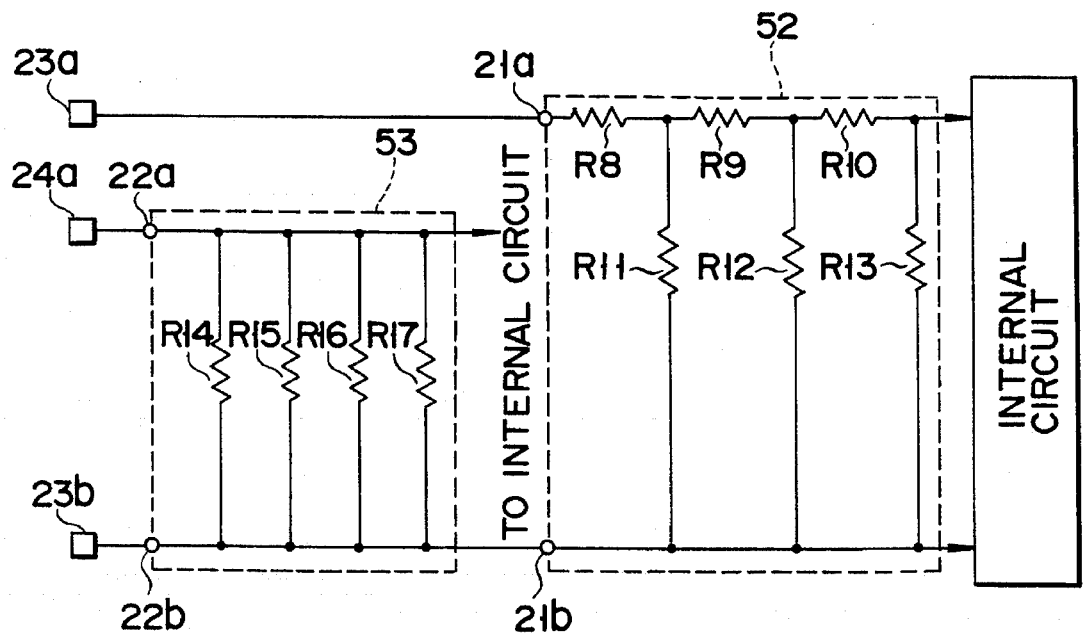
F I G. 4

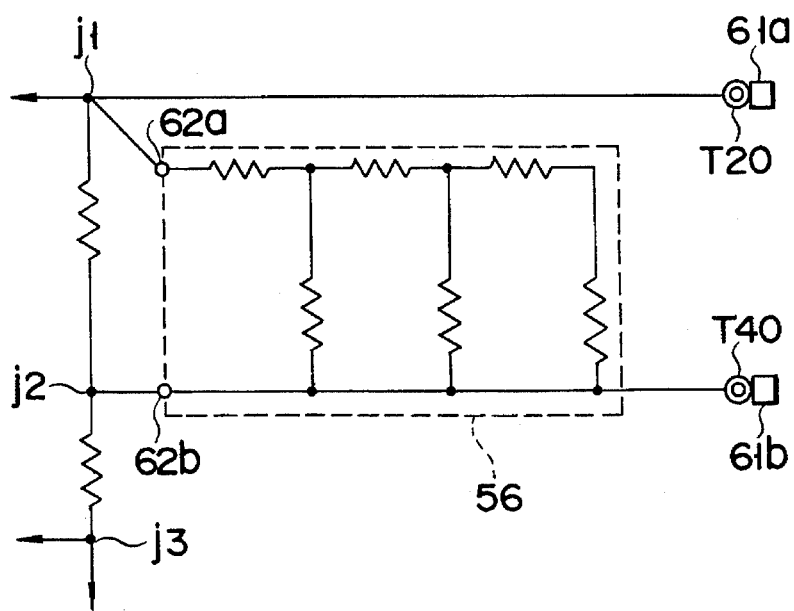
F I G. 8
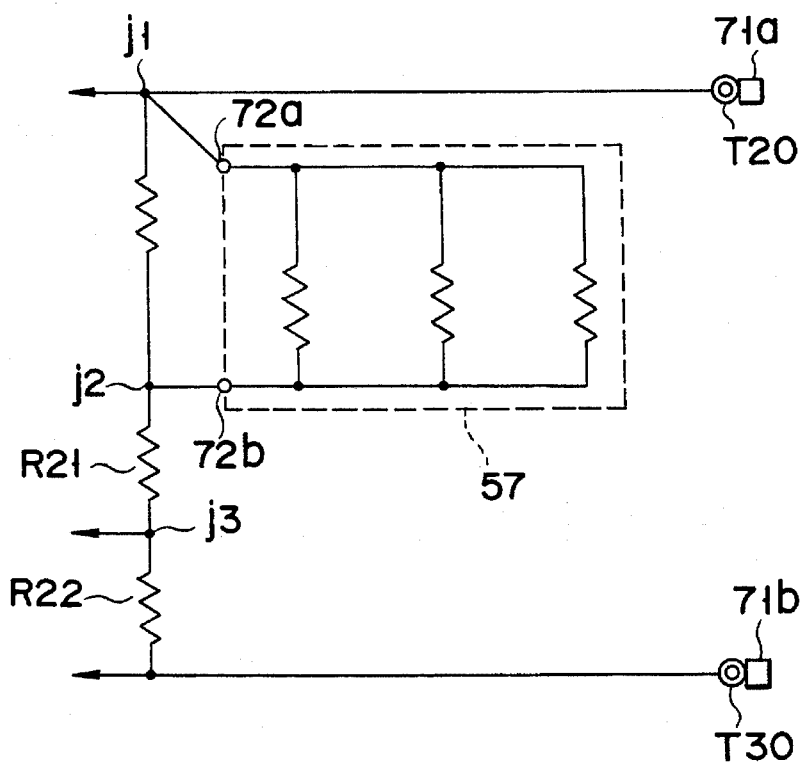
F I G. 9

SEMICONDUCTOR DEVICE WHOSE OUTPUT CHARACTERISTIC CAN BE ADJUSTED BY FUNCTIONAL TRIMMING

This application is a continuation of application Ser. No. 07/680,257 filed Apr. 4, 1991, now abandoned.

BACKGROUND OF THE INVENTION

1. Field of the Invention

This invention relates to a semiconductor device whose output characteristic can be adjusted by functional trimming, and more particularly to a semiconductor device which has a resistor network including trimming polysilicon resistors and whose output characteristic can be adjusted by selectively passing current in the polysilicon resistors to fuse the same.

2. Description of the Related Art

In recent years, in semiconductor devices such as semiconductor integrated circuits and hybrid integrated circuits, the functional trimming is used as a means of deriving a highly precise output characteristic. In a case where the main factor for determining the output characteristic of the semiconductor device is a resistor, for example, the functional trimming is to change the resistances of the trimming resistors and adjust the output characteristic by setting the semiconductor device into the operative state and selectively cutting off or machining the trimming resistors while measuring the output characteristic.

As the conventional method of changing the resistance by the functional trimming, a method of forming a resistor network including trimming resistors in a silicon chip or wafer and selectively cutting off the trimming resistors by use of laser or the like so as to change the resultant resistance is known as is disclosed in U.S. Pat. No. 4,906,966, for example.

However, in order to effect the above trimming method, it is necessary to operate the laser machining device while measuring the electrical characteristic of the semiconductor device. For this reason, the manufacturing device becomes large in size and becomes expensive and it is necessary to effect the test again after assembling, thereby increasing the manufacturing cost. Further, since the trimming resistors are fused by application of a laser beam through the chip surface after the manufacturing process for the semiconductor device is completed, it becomes impossible to cover the trimming resistor with a protection film such as a passivation film, thus lowering the reliability. Even if the resistance is adjusted before assembling, the electrical characteristic of the semiconductor device may be slightly changed by the stress and the thermal stress to which the silicon chip is subjected in the assembling process, thereby causing the resistance to be different from a desired value after the assembling. In addition, when it is used in the power semiconductor device, it is often difficult to effect the characteristic test at the time of large power operation and therefore it is impossible to adjust the resistance while effecting the test for the output characteristic under the above circumstance.

SUMMARY OF THE INVENTION

Accordingly, a first object of this invention is to provide a semiconductor device which may permit the functional trimming to be effected without causing the size of the manufacturing apparatus to be increased and may suppress rise in the cost of the product.

A second object of this invention is to provide a semiconductor device which may prevent reduction in the reliability due to the functional trimming.

A third object of this invention is to provide a semiconductor device which is free from the influence such as variation in the element characteristic caused by assembling even when the functional trimming is effected.

A fourth object of this invention is to provide a semiconductor device which may solve the difficulty in adjusting the electrical characteristic caused by the functional trimming effected at the time of large power operation.

The above first to fourth objects can be attained by a semiconductor device whose electrical characteristic can be adjusted by the functional trimming, comprising a plurality of trimming resistors which can be selectively fused according to the value of current flowing therein; a connecting section for connecting the plurality of resistors together at one-side ends thereof and connecting them together at the other ends thereof so as to connect the plurality of resistors in parallel; and a power supply section for supplying current to selectively fuse the plurality of resistors to the connecting section.

With the above construction, the resultant resistance of the resistors connected in parallel by means of the connecting section can be changed to adjust the output characteristic of the semiconductor device by passing current into the trimming resistors so as to selectively fuse the resistors.

Since the resistors are electrically cut off, the trimming process and the measuring process by use of the electrical characteristic measuring device for the semiconductor device can be effected by use of the same device to adjust the resistance so as to attain a desired electrical characteristic. As a result, a functional trimming device can be made simple in construction and the cost of the products can be reduced.

Unlike the conventional trimming using the laser, it is not necessary to expose the surface of the trimming resistors and it is possible to form a protection film on the trimming resistors, thereby preventing reduction in the reliability due to the functional trimming.

If the terminals are lead out from the package of the semiconductor device and used as power supply terminals, adjustment of the resistance can be made after the final assembling. As a result, even if the resistance and the internal element characteristic are changed by the stress and thermal stress in the die bonding and molding process, the influence caused by the above variation can be adjusted at the final stage of the manufacturing process.

Further, since the functional trimming can be effected after the device is sealed into a package, the output characteristic of a large power semiconductor device can be adjusted while it is set in the large power operation mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3 and 4 are circuit diagrams showing other examples of the construction of the resistor network including the trimming resistors, for illustrating semiconductor devices according to second and third embodiments of this invention;

FIGS. 6 to 9 are circuit diagrams of extracted main portions of the semiconductor device of FIG. 5 in which a resistor network including the trimming resistors is formed.

DETAILED DESCRIPTION OF THE PREFERRED EMBODIMENTS

Figure 1A:
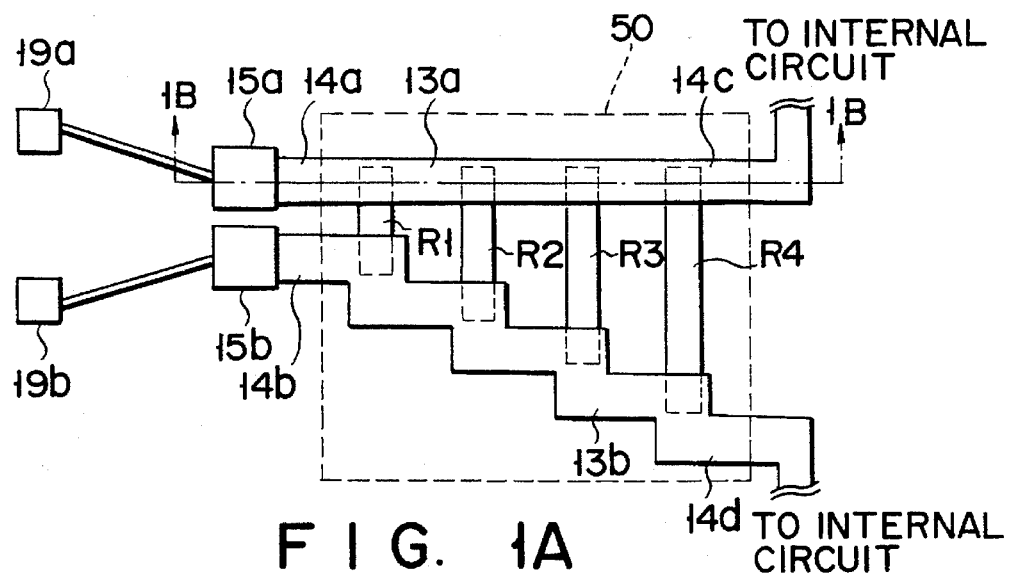
FIG. 1A is a pattern plan view of a resistor network including trimming resistors in a semiconductor device according to a first embodiment of this invention.
Figure 1B:
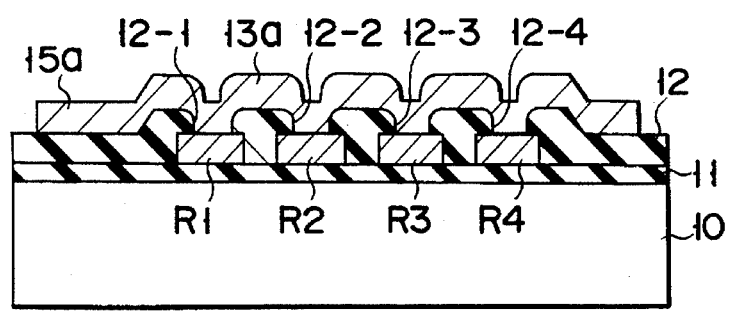
FIG. 1B is a cross sectional view taken along the line 1B—1B of the pattern of FIG. 1A.

FIG. 1A is a plan view showing an example of the pattern construction of a resistor network included in a semiconductor device according to a first embodiment of this invention and FIG. 1B is a cross sectional view taken along the line 1B—1B of the pattern of FIG. 1A. A resistor network 50 includes trimming polysilicon resistors R1 to R4 which can be fused by passing current therethrough and the trimming resistors R1 to R4 are connected in parallel by means of Al wiring layers 13a and 13b. The resistors R1 to R4 have the same width and different lengths and formed on a silicon oxide film 11 formed on a silicon substrate 10. An inter-level insulation film (silicon oxide film) 12 is formed on the silicon oxide film 11 and the Al wiring layers 13a and 13b are formed on the inter-level insulation film 12. The Al wiring layer 13a is connected to one-side ends of the resistors R1 to R4 via contact holes 12-1 to 12-4 formed in the inter-level insulation film 12. The Al wiring layer 13b is connected to the other ends of the resistors R1 to R4 via contact holes (not shown) formed in the inter-level insulation film 12. Pads 15a and 15b are respectively formed on one-side ends 14a and 14b of the Al wiring layers 13a and 13b. First and second terminals 19a and 19b used as power supply sections for passing current into the resistors R1 to R4 to selectively fuse the resistors are connected to the pads 15a and 15b. The terminals 19a and 19b are lead out to the exterior of the package so as to receive a voltage from the exterior. The other ends 14a and 14b of the Al wiring layers 13a and 13b are connected to circuits in the semiconductor device (semiconductor integrated circuit). The resistor network 50 functions as one resistor.

With the above construction, in order to set the electrical characteristic of the semiconductor device within a specified standard, a voltage is applied across the terminals 19a and 19b lead out to the exterior of the package to pass current into the resistors R1 to R4 of the resistor network 50 and selectively fuse the same. At this time, the resultant resistance of the resistor network 50 is gradually increased to a desired resistance by gradually raising the voltage to sequentially fuse the resistors in an order from the resistor R1 to the resistor R4 while monitoring the electrical characteristic of the semiconductor device.

The polysilicon resistors R1 to R4 (polysilicon film) may be fused by passing current of excessively high current density into the same to make a completely open-circuit state. In general, the current capacity is extremely small for a polysilicon film with a thickness of approx. 0.3 to 1.0 μm in comparison with a single crystalline film of the same thickness. Therefore, a silicon oxide film adjacent to the polysilicon film will not be damaged when it is fused by passing current therein. The resistor set in the open-circuit state can be regarded as being completely removed, thereby giving no influence to the reliability.

For example, when a polysilicon film having a sheet resistance of 80 Ω/□(thickness of 0.35 μm) obtained by doping arsenic into undoped polysilicon is machined to have a width of 10 μm and a length of 120 μm, a polysilicon resistor of 960 Ω can be obtained. The resistor can be completely fused to make an open-circuit state by passing current of approx. 30 mA into the same. That is, the resistor can be cut off by using current of approx. 3 mA for the width of 1.0 μm. The resistors R1 to R4 of the resistor network 50 shown in FIG. 1A are formed to have the same width and are made sequentially longer in an order from the resistor R1 to resistor R4 so that the resistances of the resistors R1, R2, R3 and R4 may be set to r, 2r, 3r and 4r.

In the embodiment described above, use is made of resistors having the same current capacity and different lengths (i.e., different resistances), and are cut one after another, in the ascending order of resistance. According to the invention, use can be made of resistors which have the same resistance and different current capacities. If such resistors are used, they will be cut one after another, in the ascending order of current capacity.

Figure 2:
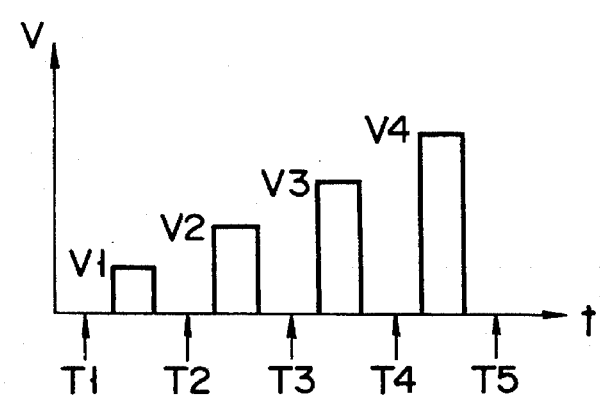
FIG. 2 is a diagram showing the relation between a voltage for permitting current to flow in the trimming resistors and fuse the same and the time of application of the voltage.

Next, an example of a method of adjusting the characteristic of the semiconductor device having the resistor network 50 which includes the above trimming polysilicon resistors is explained with reference to FIG. 2. The abscissa of FIG. 2 indicates elapse of time t and the ordinate thereof indicates a voltage V applied between the external terminals 19a and 19b (power supply sections). The voltages V1 to V4 indicate voltage values for causing the resistors R1 to R4 to be fused, and T1 to T5 indicate times at which the electrical characteristic of the semiconductor device is measured. First, the electrical measurement is effected at time T1. If an unsatisfactory output characteristic is obtained as the result, a voltage V1 is applied between the terminals 19a and 19b. Since, in this case, the largest current flows in the resistor R1, the resistor R1 is first cut off. As a result, the resultant resistance of the resistor network 50 is increased. Then, the same measurement for the electrical characteristic is effected. If the output characteristic is still unsatisfactory, a voltage V2 is applied between the terminals 19a and 19b. As a result, the resistor R2 is cut off, and the resultant resistance of the resistor network 50 is further increased. The resistors R1 to R4 are sequentially cut off in the same manner as described above until a desired electrical characteristic can be obtained so that the resultant resistance of the resistor network 50 can be set to an optimum value.

Next, an example of a schematic manufacturing process for the semiconductor device including the resistor network 50 is explained with reference to FIGS. 1A and 1B. As shown in FIG. 1B, a silicon oxide film 11 is first formed on the main surface of a silicon substrate 10 and then an undoped polysilicon layer is deposited on the oxide film 11 by use of a CVD device or the like. The polysilicon layer is patterned by photo-etching to form patterns of the resistors R1 to R4 as shown in FIG. 1. After this, impurity such as boron, arsenic or phosphorus is doped into the resistors R1 to R4 by a proper impurity doping technique such as the ion-implantation technique so as to lower the resistances of the polysilicon resistors R1 to R4. Then, an inter-level insulation film (silicon oxide film) 12 is formed by deposition on the oxide film 11 and the resistors R1 to R4, and contact holes 12-1 to 12-4 are formed in those portions of the insulation film 12 which lie on both ends of the resistors R1 to R4. An aluminum layer is formed by vapor deposition on the inter-level insulation film 12 and the aluminum layer is patterned to form Al wiring layers 13a and 13b. After this, the same process as in formation of an ordinary semiconductor chip such as formation of a surface protection film is effected to complete the chip. The thus completed chip is sealed into a package and assembled by a normal assembling technique. After the assembling, the trimming for the resistor network 50 is effected while measuring the output characteristic of the semiconductor device as described before to complete the product.

FIG. 3 is a circuit diagram showing another example of the construction of the resistor network. The resistors R1 to R4 are trimming polysilicon resistors. Resistors R5 to R7 are diffusion resistors formed in the silicon substrate. The resistors R5 to R7 are resistors formed of shallow impurity diffusion layers with a depth of approx. 1 μm, for example, formed to have patterns with an width of 6 μm and a length of 50 μm, and formed with current capacities of larger than 150 mA. Therefore, in a case where the resistors R1 to R4 are formed to have the resistance of r and the resistors R5 to R7 are formed to have the resistance of r, the resistors R1 to R4 can be sequentially cut off in this order without cutting off the resistors R5 to R7 by sequentially applying voltages V1 to V4 between he first terminal 17a and second terminal 17b as shown in FIG. 2 so as to adjust the resultant resistance of the resistor network 51.

This invention is not limited to the above embodiments. For example, in the above embodiments, an example in which one trimming network is formed in each chip is explained, but as shown in FIG. 4, a plurality of trimming resistor networks can be formed in one chip. A first resistor network 52 is formed to include resistors R8 to R10 (diffusion resistors) and trimming polysilicon resistors R11 to R13, and a second resistor network 53 is formed to include trimming polysilicon resistors R14 to R17. The resistors R8 to R10 of the resistor network 52 are series-connected between a terminal 21a and an internal circuit, and the resistors R11 to R13 are connected in parallel between one end of each of the resistors R8 to R10 and a terminal 21b. The trimming resistors R14 to R17 of the resistor network 53 are connected in parallel between terminals 22a and 22b. The terminal 21a is connected to an external terminal 23a which is lead out to the exterior of the package, the terminal 22a is connected to an external terminal 24a, and the terminals 21b and 22b are connected to an external terminal 23b.

With the construction shown in FIG. 4, the resistors R11 to R13 of the resistor network 52 may be selectively trimmed by voltages applied between the external terminals 23a and 23b and the resistors R14 to R17 of the resistor network 53 may be selectively trimmed by voltages applied between the external terminals 24a and 23b. Therefore, the output characteristic of the semiconductor device can be adjusted more precisely with a higher degree of freedom in comparison with a case wherein only one trimming resistor network is used.

Figure 5:
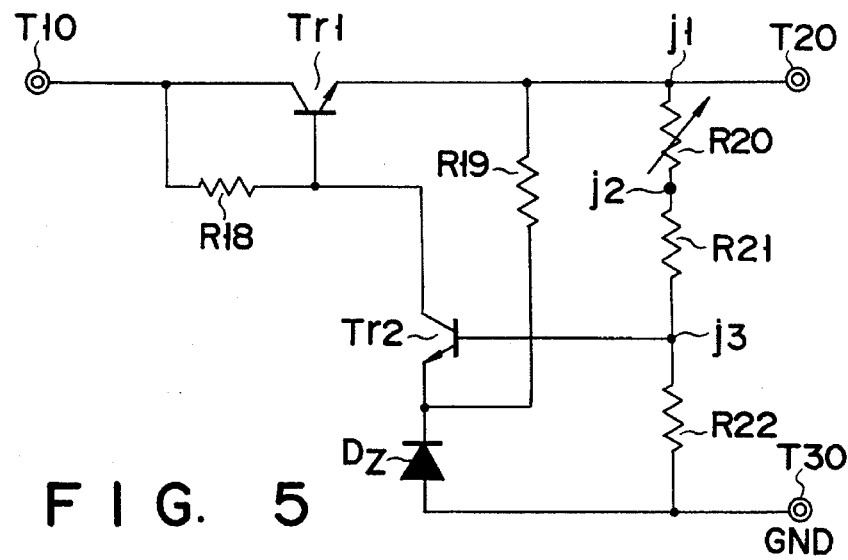
FIG. 5 is a circuit diagram showing an example of a semiconductor device to which this invention is applied.

Next, a case wherein this invention is applied to a series regulation type stabilizing power supply IC (series regulator) is explained. FIG. 5 is a circuit diagram showing the basic construction of the stabilizing power supply IC. The collector of a control transistor Tr1 is connected to an input terminal T10 which is lead out to the exterior of the package and the emitter thereof is connected to an output terminal T20. A resistor R18 is connected between the base and collector of the transistor Tr1. The collector of an error amplification transistor Tr2 is connected to the base of the transistor Tr1 and the emitter thereof is connected to the cathode of a diode Dz. A resistor R19 is connected between the emitters of the transistors Tr1 and Tr2. An output voltage adjusting variable resistor R20, resistor R21 and resistor R22 are series-connected between the output terminal T20 and a ground terminal T30. The base of the transistor Tr2 is connected to a connection node j3 between the resistors R21 and R22. The anode of the diode Dz is connected to the ground terminal T30.

With the above construction, a voltage between the output terminal T20 and the ground terminal T30 is divided according to the ratio of the sum of the resistances of the resistors R20 and R21 to the resistance of the resistor R22 and appears on the connection node j3. A difference voltage between a reference voltage determined by the diode Dz and the voltage on the connection node j3 is applied between the base and emitter of the error amplification transistor Tr2. When the output voltage varies for any reason, a voltage obtained by dividing the output voltage by the resistors R20 to R22 is compared with the reference voltage and a voltage corresponding to a difference between the compared voltages is fed back to the base of the transistor Tr1. As a result, the output voltage is kept at a constant stable voltage level. Therefore, in order to obtain a desired output voltage characteristic, it is necessary to precisely adjust the sum (R20+R21) of the resistances of the resistors R20 and R21 which determine the voltage dividing ratio.

FIGS. 6 to 9 illustrate examples of the construction in a case where a trimming resistor network is provided in the stabilizing power supply IC shown in FIG. 5 and are circuit diagrams showing an extracted main portion thereof. In the drawing, a ○ mark indicates a first or second terminal of the resistor network, a □ mark indicates a first or second power supply section, and a ⓞ mark indicates an external terminal of the semiconductor device.

Figure 6:
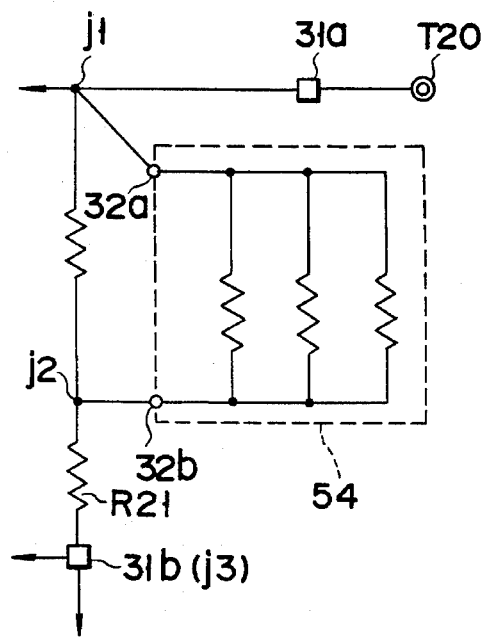
Figure 7:
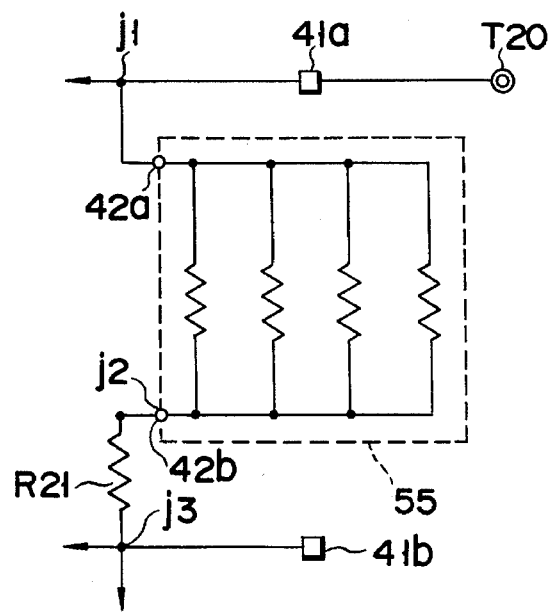

FIGS. 6 and 7 illustrate examples of the construction in a case where the functional trimming is effected for the chip itself (that is, the structure obtained before it is sealed into a package). In FIG. 6, a first terminal 32a of a resistor network 54 is connected to a first power supply section 31a and a second terminal 32b thereof is connected to a second power supply section 31b via a resistor R21. The first and second power supply sections 31a and 31b are local areas on metal wiring layers which can press the power supply terminals with sufficiently large force and are preferably formed by use of wire bonding pads, for example. In FIG. 7, a first terminal 42a of a resistor network 55 is connected to a first power supply section 41a (also used as a wire bonding pad) and a second terminal 42b thereof is connected to a second power supply pad 41b which is additionally provided.

FIGS. 8 and 9 show examples of the construction obtained in a case wherein the functional trimming is effected after the final assembling process (or the packaging process). In FIG. 8, a first terminal 62a of a resistor network 56 is connected to an output package terminal T20 which is also used as a first power supply section 61a and a second terminal 62b thereof is connected to a power supplying external terminal T40 which is newly provided as a second power supply section 61b. In FIG. 9, first and second terminals 72a and 72b of a resistor network 57 are respectively connected to an output terminal T20 and ground terminal T30 which are also used as first and second power supply sections 71a and 71b.

As described above, in the semiconductor device of this invention, the resultant resistance of the resistor network is changed by passing current into the resistors included in the resistor network to selectively fuse the resistors, thereby adjusting the output characteristic of the semiconductor device. Therefore, the machining apparatus for the trimming can also be used as the electrical characteristic measuring apparatus so that the manufacturing apparatus can be made simple in construction and rise in the manufacturing cost can be suppressed. Further, it becomes possible to form a protection film on the trimming resistors by properly selecting the power supply section and reduction in the reliability caused by using the functional trimming can be suppressed. Since the resistance can be adjusted after the final assembling if the power supply sections are formed as the terminals lead out to the exterior of the package, the desired resistance and desired element characteristic can be obtained even if they are changed by the stress and the thermal stress occurring in the assembling process because they can be adjusted at the final stage. Further, since the functional trimming can be effected after the chip is sealed into the package, the output characteristic of a large power semiconductor device can be adjusted while it is set in the large power operation mode.

What is claimed is:

1. A semiconductor device having an output characteristic adjustable by functional trimming, comprising:

a plurality of trimming resistor means, each of said trimming resistor means being selectively fusible according to the value of current flowing therein;

connecting means for connecting said plurality of resistor means together in parallel;

a protection film formed on said plurality of trimming resistor means; and power supply means connected to said connecting means for supplying current to said plurality of resistor means, said current having a selected value sufficient to selectively fuse one or more of said plurality of resistor means.

2. A semiconductor device according to claim 1, wherein said plurality of resistor means include polysilicon resistors.

3. A semiconductor device according to claim 2, wherein the plane patterns of said polysilicon resistors have the same width and different lengths.

4. A semiconductor device according to claim 2, wherein said polysilicon resistors have different current capacities.

5. A semiconductor device according to claim 1, wherein said connecting means includes a first wiring layer to which one-side ends of said plurality of resistor means are connected and a second wiring layer to which the other ends of said plurality of resistor means are connected.

6. A semiconductor device according to claim 5, wherein said first and second wiring layers contain aluminum as main component thereof.

7. A semiconductor device according to claim 5, wherein said first wiring layer includes an impurity diffusion layer and said second wiring layer contains aluminum as a main component thereof.

8. A semiconductor device according to claim 1, wherein said plurality of trimming resistor means are sealed in a package, said connecting means including first and second terminals external to said package, and said power supply means being connected to said first and second external terminals for causing current to flow in said plurality of resistor means to selectively fuse said plurality of resistor means.

9. A semiconductor device according to claim 1, wherein said plurality of trimming resistor means are sealed in a package, said connecting means including first and second terminals external to said package for selectively fusing said plurality of trimming resistor means after being sealed in said package.

10. A semiconductor device according to claim 1, wherein said plurality of trimming resistor means are sealed in a package, said connecting means including first and second terminals external to said package for selectively fusing said plurality of trimming resistor means after being sealed in said package and for measuring the output characteristic of said semiconductor device.

* * * * *